United States Patent [19]

Ito et al.

[11] Patent Number: 5,032,544
[45] Date of Patent: Jul. 16, 1991

[54] PROCESS FOR PRODUCING SEMICONDUCTOR DEVICE SUBSTRATE USING POLISHING GUARD

[75] Inventors: Tatsuo Ito, Jouetsu; Yasuaki Nakazato, Koushoku, both of Japan

[73] Assignee: Shin-Etsu Handotai Co., Ltd., Tokyo, Japan

[21] Appl. No.: 565,973

[22] Filed: Aug. 13, 1990

[30] Foreign Application Priority Data

Aug. 17, 1989 [JP] Japan .................................. 1-211761

[51] Int. Cl.⁵ ........................................ H01L 21/304
[52] U.S. Cl. ............................ 437/228; 148/DIG. 12; 148/DIG. 135
[58] Field of Search ............... 437/62, 86, 974, 228, 437/447, 8, 225; 148/DIG. 135

[56] References Cited

U.S. PATENT DOCUMENTS

| | | | |
|---|---|---|---|
| 4,017,341 | 4/1977 | Suzuki et al. | 437/62 |
| 4,321,747 | 3/1982 | Takemura et al. | 437/974 |
| 4,638,552 | 1/1987 | Shimbo et al. | 437/31 |
| 4,878,957 | 11/1989 | Yamaguchi et al. | 437/62 |
| 4,888,304 | 12/1989 | Nakagawa et al. | 148/DIG. 135 |
| 4,908,328 | 3/1990 | Hu et al. | 148/DIG. 135 |
| 4,948,748 | 8/1990 | Kitihara et al. | 148/DIG. 135 |

FOREIGN PATENT DOCUMENTS

| | | | |
|---|---|---|---|
| 0030284 | 3/1978 | Japan | 437/974 |
| 0068817 | 3/1988 | Japan | 437/974 |
| 0246841 | 10/1988 | Japan | 148/DIG. 135 |

*Primary Examiner*—Olik Chaudhuri
*Assistant Examiner*—Kenneth Horton
*Attorney, Agent, or Firm*—Oliff & Berridge

[57] ABSTRACT

A process for producing an SOI-structured semiconductor device substrate has the steps of: reducing the diameter of the one Si-monocrystal wafer of two bonded polished Si-monocrystal wafers to be slightly smaller than that of the other Si-monocrystal wafer so that the width of the annular margin defined between the bonded surfaces of the Si-monocrystal wafers is uniform; then forming an annular polishing guard on the cylindrical surface of the one wafer and the margin of the other wafer, the polishing guard having a predetermined thickness and being made of a material providing a polishing speed lower under the same condition than the one wafer; and then polishing the one wafer so as to make it in thin film. The polishing guard provides an accurate thickness control of the resulting Si-monocrystal thin film, in particular, even at a few micrometers level.

8 Claims, 4 Drawing Sheets

(A)

(B)

(C)

(D)

(E)

(F)

(A)

(B)

(C)

(D)

PROCESS FOR PRODUCING SEMICONDUCTOR DEVICE SUBSTRATE USING POLISHING GUARD

BACKGROUND OF THE INVENTION

1. Field of the Invention

The present invention relates to a process for producing an SOI-structured semiconductor device substrate by bonding method and more particularly to a process for producing an SOI-structured semiconductor device substrate in which a thin semiconductor monocrystal deposition film is formed on an insulating layer.

2. Description of the Related Art

In order to facilitate a device isolation in an integrated circuit or in particular, in order to overcome latchup phenomenon in a CMOS semiconductor circuit, an SOI-structured semiconductor device substrate has been provided.

In order to provide such SOI-structured semiconductor device, a process forming an oxide film constituting an insulating film on Si-monocrystal wafer and then depositing a polycrystal layer on the insulating film which is then made into a monocrystal thin film by laser etc. or a process pyrolytically depositing an Si-monocrystal thin film on sapphire substrate from a gaseous Si compound have been employed.

However, since the crystallinity of Si-monocrystal thin film on insulating film as deposited or laser fused and solidified after deposit by these prior-art processes has not been satisfied for the use of semiconductor devices, further processes have been developed. In particular, a process in which a Si-monocrystal wafer is bonded to the top surface of an insulating thin film provided on a semiconductor substrate and then the bonded Si-monocrystal wafer is thinned into a desired thin film by polishing or etching has prevailed.

This bonding process is categorized into processes using a simple weight and an electrostatic pressure in order to press the Si-monocrystal wafer to the top surface of the insulating thin film.

Unexamined Japanese patent application publication No. SHO 48-40372 discloses the weight bonding process, for example. The teaching of this publication is that a Si-monocrystal wafer is overlaid on an oxide film and bonded thereto at 1,100° C. or more under a pressure of 100 kg/cm² or more.

Pages 92-98 of "NIKKEI MICRODEVICE" published Mar. 1, 1988 by Nikkei McGraw-Hill CO. disclose the electrostatic pressure using bonding process, for example. This process will be described hereinafter.

FIG. 4(D) illustrates an example of SOI-structured semiconductor device substrates produced by electrostatic pressure bonding process. In the FIG. 4 process, there is shown the bonding of wafer 1a and wafer 1b to each other with oxide film 1c constituting an insulating film provided therebetween and then surface-grinding and/or etching the exposed top surface of the wafer 1b so that the wafer 1b is made a thin film of an SOI-structured semiconductor device substrate. In further detail, this SOI-structured semiconductor device substrate is explained as follows:

First, as shown in FIG. 4(A), thermally oxidizing the overall surface of each of the wafers 1a and 1b forms an oxide film 1c, e.g., with a 0.8 μm thickness. Then, as shown in FIG. 4(B), the wafer 1b is overlaid on the wafer 1a. The assembly of the wafers 1a and 1b is placed in a furnace. A pulsating direct or alternating voltage at about 300 V is applied to the assembly of the wafers 1a and 1b across the total thickness under the atmosphere of $N_2$ at about 500° C. Thereby, the wafers 1a and 1b are bonded. A bonding between the wafers 1a and 1b is strong so that the bonded wafers of the wafers 1a and 1b can be put into a conventional thinning process. Then, as shown in FIG. 4(C), the overall oxide film 1c formed on the top and cylindrical surfaces of the wafer 1b and a part of the wafer 1b underlying the oxide film 1c formed on the top are eliminated by surface-grinding or etching so that the thickness of the wafer 1b is uniformly reduced to a predetermined thickness over the wafer 1b. Then, as shown in FIG. 4(D), specularly polishing the resulting top surface of the wafer 1b at least to the extent of no work damage leftover therein from previous processes provides a monocrystal thin layer of SOI-structured substrate for forming a semiconductor device therein.

A polishing step will be described hereinafter.

FIGS. 2 and 3 illustrate the main part of a single-side polishing machine. In FIGS. 2 and 3, a wafer mount plate is indicated at 2. The underside of the wafer mount plate 2 has a plurality of wafers 1 which have been surface-ground and alkali-etched and detachably attached thereto by means of wax. On the other hand, the top surface of a turntable 3 provided under the wafer mount plate 2 has a polishing cloth 3a attached thereto. The single-side polishing machine press down the wafers 1 on the polishing cloth 3a by means of the wafer mount plate 2 so that the undersides of the wafers 1 attached to the underside of the wafer mount plate 2 are in contact with the polishing cloth 3a, and the wafer mount plate 2 is rotated in response to the rotation of the turntable 3. During polishing operation, a suspension with abrasive grains in the form of an abrasive slurry and controlled alkalescent by NaOH or $NH_4OH$, abrasive grains being such as colloidal silica, is fed onto the polishing cloth 3a.

However, the above-described electrostatic pressure using bonding process entails the following problems. The bond strength of the bonded wafers of the wafers 1a and 1b with the oxide film 1c therebetween is low at their periphery, so that a part of the periphery of the wafer 1b may be chipped off during a surface grinding of the wafer 1b. In this case, the oxide film 1c on the cylindrical surface of the wafer 1b is also lost as shown in FIG. 4(C). Thus, when the single-side polishing machine polishes the top surface of the wafer 1b of the bonded wafer 1 after the surface grinding, some parts of the periphery of the top surface of the wafer 1b with their adjoining parts of the cylindrical surface lacking the oxide film 1c are ready to be more polished than the remaining part of the periphery of the top surface of the wafer 1b. In particular, when the wafer 1b is made a thin film with 5 μm or less thickness, a thickness control of the resulting thin film is difficult for the above mentioned reason.

In addition, the single-side polishing machine causes an elastic deformation in the wafer mount plate 2 by means of pushing each of the wafers 1 against the polishing cloth 3a and has native differences in the peripheral speeds of radially different positions of the turntable 3 thereby to produce fluctuation in the thickness across the wafer 1b which has been polished.

Therefore, an object of the present invention is to provide a process for producing a semiconductor device substrate in which controlling a polishing amount of a wafer is easier and a variation in the thickness of the wafer can be controlled lower.

The above and other objects, and advantages of the present invention will be apparent from the attached claims and following description with reference to the drawings.

SUMMARY OF THE INVENTION

A process for producing an SOI-structured semiconductor device substrate of the present invention having the steps of: bonding the polished surfaces of two Si-monocrystal wafers each polished surface of which has an oxide film formed thereon; and eliminating part of the thickness one of the two Si-monocrystal wafers in parallel to the polished surfaces so that the one Si-monocrystal wafer is made a thin film, the process for producing the SOI-structured semiconductor device substrate comprising the steps of: reducing the diameter of the one Si-monocrystal wafer to be slightly smaller than that of the other Si-monocrystal wafer at least prior to the thin film making step so that the width of the annular peripheral margin unbonded on the other Si-monocrystal wafer surface is uniform; forming an annular polishing guard on the cylindrical surface of the one Si-monocrystal wafer prior to the thin film making step, the polishing guard having a predetermined thickness and being made of a material providing a polishing speed lower under the same polishing condition than the one Si-monocrystal wafer; and then polishing the one Si-monocrystal wafer so as to make the one Si-monocrystal wafer thinned into a thin film.

In accordance with the present invention, since the cylindrical surface of the one Si-monocrystal wafer and the unbonded annular peripheral margin of the other Si-monocrystal wafer together have the polishing guard on each of them, the resulting Si-monocrystal thin film the thickness of which is regulated by the polishing guard is finally produced even though the polishing rates are partially varied over the surface of the one Si-monocrystal.

Thus, the thickness of the polishing guard can control the thickness of the Si-monocrystal thin film produced from the one Si-monocrystal wafer even when the thickness of the depositing Si thin film is at a lower level, e.g., in a range of a few micrometers.

In addition, when the polishing guard is formed prior to a surface-grinding of the one Si-monocrystal wafer directly followed by said polishing step, the periphery of the one Si-monocrystal wafer cannot be chipped during the surface-grinding.

DESCRIPTION OF THE PREFERRED EMBODIMENTS

Figure 1:
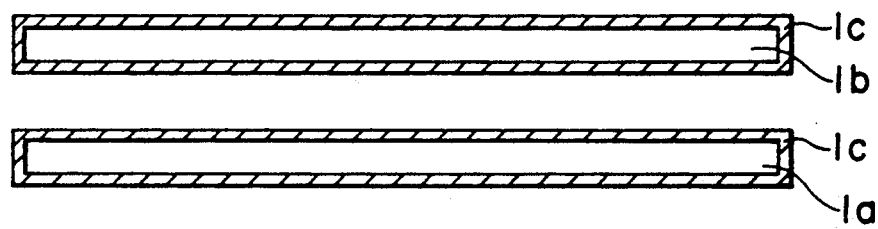
FIGS. 1(A) to (F) are illustrations of the steps of a process for producing a semiconductor device substrate of an embodiment of the present invention.
Figure 1:
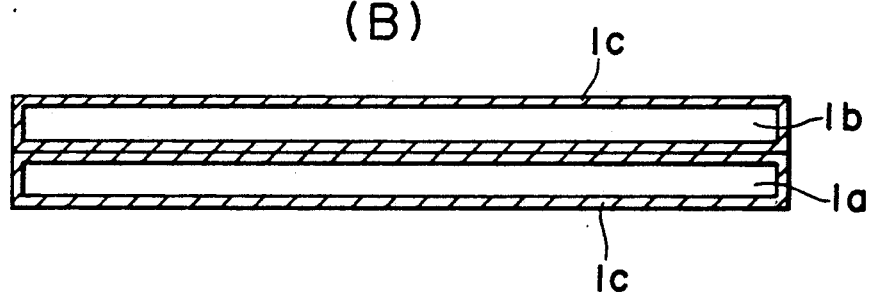
Figure 1:
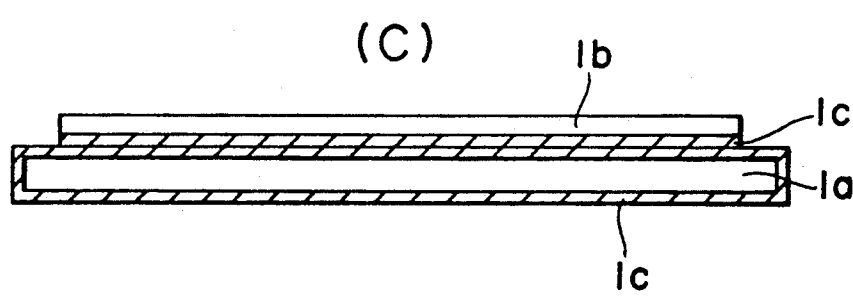
Figure 1:
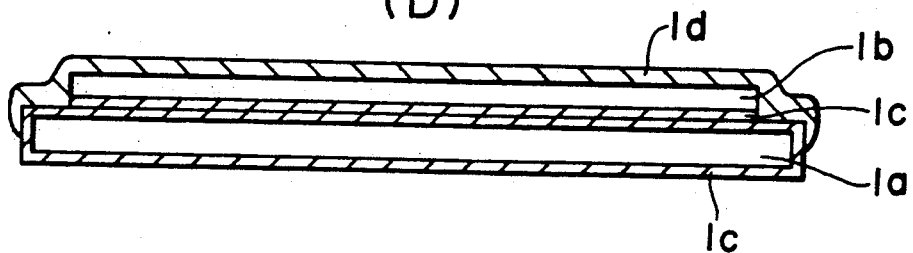
Figure 1:
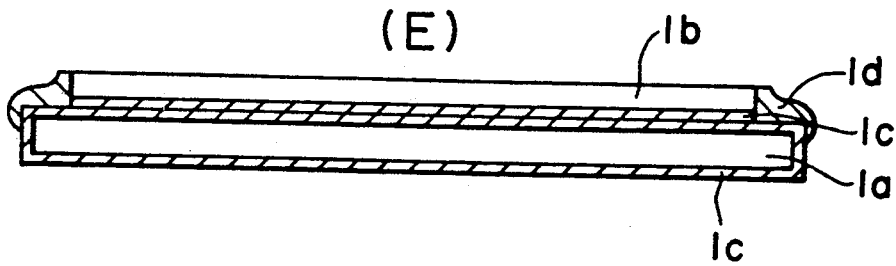
Figure 1:
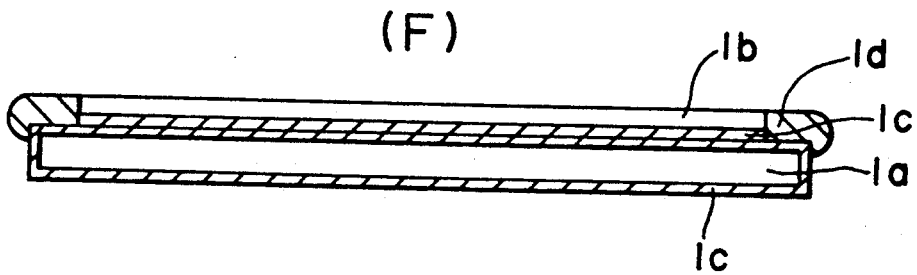

The preferred embodiments of the present invention will be described with reference to FIGS. 1-3 hereinafter.

FIG. 1(F) illustrates a longitudinal section through a final form of an SOI-structured semiconductor device substrate of the present invention.

In summary, making in thin film the wafer 1b of a wafer bonding 1 comprising circular Si-monocrystal wafers 1a and 1b bonded to each other with an oxide film 1c provided therebetween provides the SOI-structured semiconductor device substrate.

In detail, the process for producing the SOI-structured semiconductor device substrate is as follows:

First, as shown in FIG. 1(A), thermally oxidizing the overall surfaces of the wafers 1a and 1b produces oxide film 1c thereon. Then, as shown in FIG. 1(B), the wafer 1b is overlaid on the wafer 1a to provide an assembly, which is then placed in a furnace. The assembly of the wafers 1a and 1b is heated at 400° C. and applied to with a 400 V pulsating voltage so as to bond the wafers 1a and 1b. Then, surface-grinding or etching the oxide film 1c covering the top surface and cylindrical surface of the wafer 1b eliminates it. In this step, when the diameters of the wafers 1a and 1b equal each other, a part of the wafer 1b with a low bond strength, i.e., the periphery of the wafer 1b is chipped to scatter, so that the oxide film 1c formed on the cylindrical surface of the wafer 1b is concurrently lost.

Then, the resulting exposed overall peripheral edge of the wafer 1b is uniformed so that the periphery of the wafer 1b is etched off, e.g., by means of a photoresist mask. In particular, the diameter of the wafer 1b is adjusted to about 3–5 mm less than that of the wafer 1a. Thus, as shown in FIG. 1(C), a corresponding annular peripheral area of the top surface of the wafer 1a which has a uniform width around the wafer 1a is developed. Alternatively, the diameter of the wafer 1b may be made some amount below that of the wafer 1a prior to the uniforming step above mentioned.

Then, as shown in FIG. 1(D), a CVD oxidation film 1d with a 5 μm or less thickness made of $SiO_2$, for example, is produced on the cylindrical and top surface of the wafer 1b and the unbonded annular peripheral margin of the top surface of the wafer 1a. Then, as shown in FIG. 1(E), surface-grinding or etching the part of the CVD oxidation film 1d produced on the top surface of the wafer 1b is performed to eliminate completely same part.

Then, as shown in FIG. 1(F), the exposed top surface of the wafer 1b is specularly polished.

Figure 2:
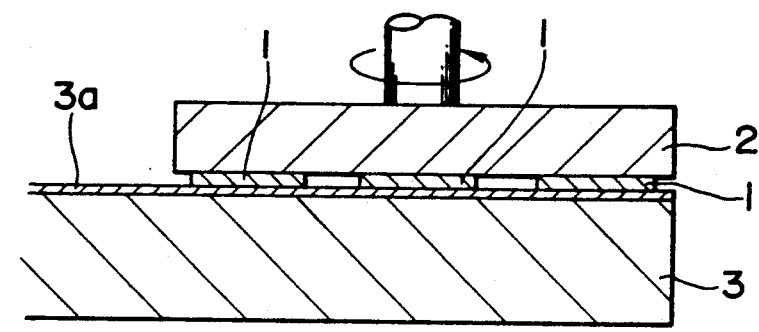
FIG. 2 is a diagrammatic longitudinal section through the main part of a single-side polishing machine for a wafer used as the semiconductor device substrate of FIG. 1.
Figure 3:
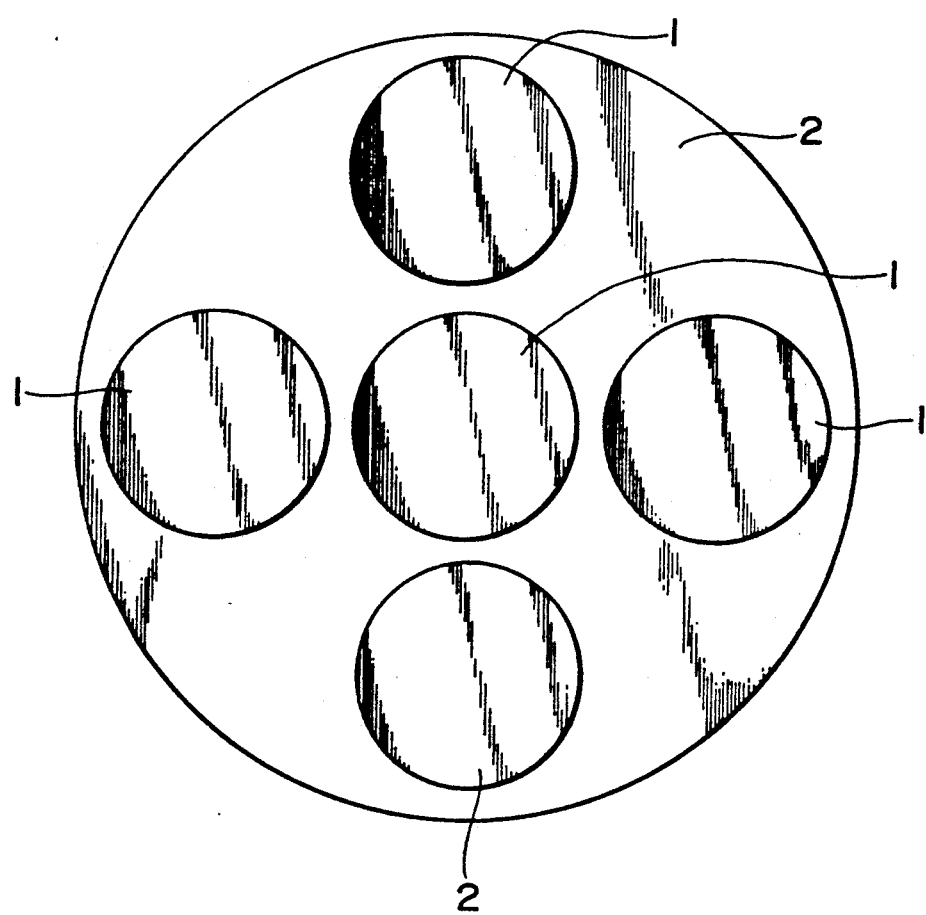
FIG. 3 is a bottom view of a wafer mount plate, illustrating a condition of mounting wafers of FIG. 2 to the underside of the wafer mount plate.
Figure 4:
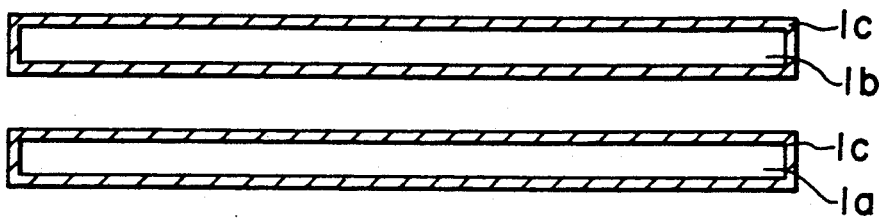
FIGS. 4(A) to (D) are illustrations of the steps of a prior-art process for producing a semiconductor device substrate.
Figure 4:
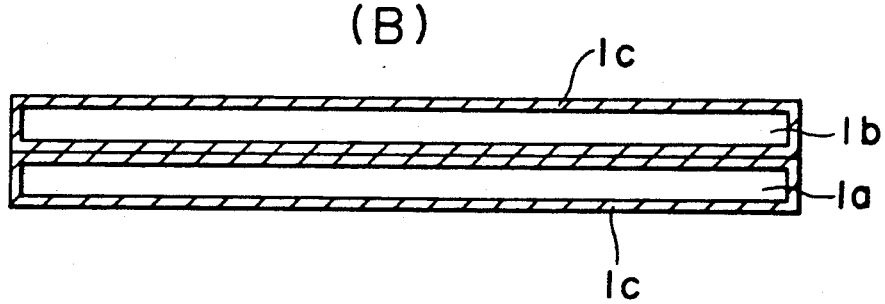
Figure 4:
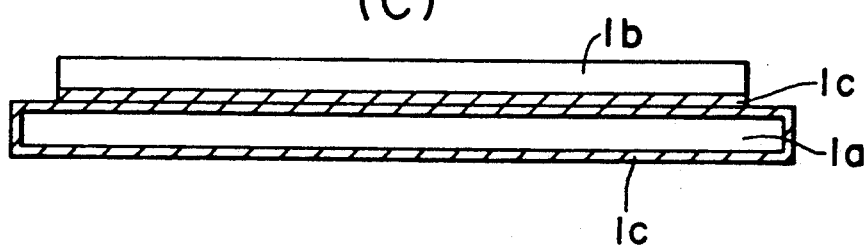
Figure 4:
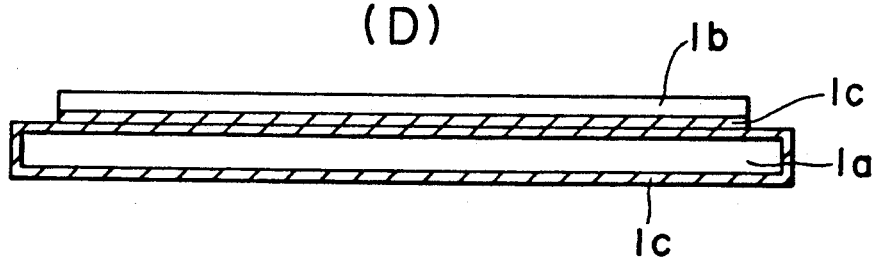

A conventional single-side polishing machine of FIG. 2 also specularly polishes the top surface of the wafer 1b of the wafer bonding 1 of the present invention as follows:

As shown in FIGS. 2 and 3, a plurality of bonded wafers 1 are detachably fixed with wax to the underside of the wafer mount plate 2. The wafer mount plate 2 pushes the bonded wafers 1 on the polishing cloth 3a. The turntable 3 rotates the wafer mount plate 2 without an additional driving means so that the polishing cloth 3a and the bonded wafers 1 are in sliding contact with each other. During polishing, an alkalescent aqueous solution of NaOH or $NH_4OH$ with abrasive grains such as colloidal silica suspended therein is fed to the polishing cloth 3a as an abrasive slurry.

In accordance with the process of the embodiment of the present invention, a polishing guard or stopper 1d with a stepped section and provided on the margin of the top surface of the wafer 1a check a polishing rate or speed of the wafer 1b of the bonded wafer 1. The polishing guard 1d provides a polishing rate or speed lower under the same condition than the wafer 1b. A narrower portion of the polishing guard 1d is readily eliminated because of its narrowness surface-grinding or polishing of the wafer 1b. Even when the pressure from the wafer mount plate 2 to the turntable 3 is increased in order to accelerate a polishing speed of each of the bonded wafers 1, the top surface of a wider portion of the polishing guard 1d supports a more part of the pressure from the wafer mount plate 2 near the completion of the polishing of the bonded wafers 1. The polishing speed of each of the bonded wafers 1 is then decreased, so that controlling a polished amount of the bonded wafers 1 and thereby the thickness of the Si-monocrystal thin film produced from the wafer 1b is facilitated. In addition, a variation in the thickness of the Si-monocrystal thin film produced from the wafer 1b was controlled within plus or minus 10% of a 5 μm target thickness of the Si-monocrystal thin film produced from the wafer 1b.

Thus, the embodiment of the present invention can provide a reliable semiconductor device substrate.

In addition, a surface-grinding of the wafer 1b of the FIG. 1(E) step cannot chip the periphery of the wafer 1b.

The polishing guard 1d of the above embodiment is made of CVD $SiO_2$ film. However, the polishing guard may be alternatively made of thermal oxidation film, a silicon nitride film or other material films providing a polishing guard. The thermal oxidation film and silicon nitride film, which provide polishing rates greater than the CVD oxidation film of the embodiment, provide a better polishing guard.

The embodiments of the present invention have been particularly described. However, the present invention will not be restricted to the above embodiments. It would be apparent to a person skilled in the art that he can make various changes and modifications without departing from the range and scope of the invention.

What is claimed is:

1. A process for producing an SOI-structured semiconductor device substrate having the steps of: bonding polished surfaces of two Si-monocrystal wafers at least one of which has an oxide film formed on the bonded polished surface; and uniformly eliminating part of the thickness of one of the two Si-monocrystal wafers in parallel to the polished surface so that a thin film is resulted from the one Si-monocrystal wafer in addition, the process for producing the SOI-structured semiconductor device substrate comprising the steps of:
   reducing the diameter of the one Si-monocrystal wafer to be slightly smaller than that of the other Si-monocrystal wafer at least prior to the thin film making step so that the width of the unbonded annular peripheral margin exposed on the surface of the other Si-monocrystal wafer is uniform along all the periphery;
   forming an annular polishing guard on the cylindrical surface of the one Si-monocrystal wafer and said margin prior to the thin film making step, the guard having a predetermined thickness and being made of a material of a lower polishing rate relative to the polishing rate of the one Si-monocrystal wafer; and then
   polishing the one Si-monocrystal wafer so as to make the one Si-monocrystal wafer thinned into a thin film, said polishing guard acting to control the polishing rate.

2. A process for producing an SOI-structured semiconductor device substrate as recited in claim 1, wherein the polishing guard is made of $SiO_2$.

3. A process for producing an SOI-structured semiconductor device substrate as recited in claim 1, wherein the polishing guard is made of silicon nitride.

4. A process for producing an SOI-structured semiconductor device substrate as recited in claim 2, wherein the $SiO_2$ is produced by thermal oxidation.

5. A process for producing an SOI-structured semiconductor device substrate as recited in claim 2, wherein the $SiO_2$ is produced by CVD process.

6. A process for producing an SOI-structured semiconductor device substrate as recited in claim 1, wherein the polishing guard has a stepped section comprising a narrower portion at the outermost of said margin and a wider portion close to or at the innermost of said margin.

7. A process for producing an SOI-structured semiconductor device substrate as recited in claim 1, wherein said predetermined thickness of said annular polishing guard is about 5 μm.

8. A process for producing an SOI-structured semiconductor device substrate, comprising:
   bonding together polished surfaces of two Si-monocrystal wafers, at least one of said surfaces being coated with an oxide film;
   reducing the diameter of one said Si-monocrystal wafer to form a uniform unbonded annular peripheral margin on the surface of the other said Si-monocrystal wafer;
   forming an annular polishing guard on the cylindrical surface of said one Si-monocrystal wafer and the margin of said other Si-monocrystal wafer, the guard being made of a material of a lower polishing rate relative to the polishing rate of said one Si-monocrystal wafer; and
   polishing said one Si-monocrystal wafer to form a thin film, said polishing guard acting to control the polishing rate.

* * * * *